(12) United States Patent
Hsueh et al.

(10) Patent No.: US 7,785,963 B2
(45) Date of Patent: Aug. 31, 2010

(54) METHOD FOR FABRICATING INVERTED T-SHAPED FLOATING GATE MEMORY

(75) Inventors: Ming-Hsiang Hsueh, Hsinchu (TW); Yen-Hao Shih, Taipei County (TW); Erh-Kun Lai, Taichung County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 152 days.

(21) Appl. No.: 12/036,196

(22) Filed: Feb. 22, 2008

(65) Prior Publication Data

US 2009/0215256 A1 Aug. 27, 2009

(51) Int. Cl.
*H01L 21/8239* (2006.01)
(52) U.S. Cl. .................. 438/260; 438/264; 438/594; 257/E21.624
(58) Field of Classification Search ............... 438/260; 257/E21.624
See application file for complete search history.

(56) References Cited

U.S. PATENT DOCUMENTS

| | | | | |
|---|---|---|---|---|
| 7,170,131 | B2* | 1/2007 | Yuan | 257/321 |
| 2005/0287763 | A1* | 12/2005 | Kim et al. | 438/424 |
| 2006/0131635 | A1* | 6/2006 | Lai et al. | 257/315 |
| 2006/0292802 | A1* | 12/2006 | Lee et al. | 438/264 |
| 2008/0105916 | A1* | 5/2008 | Watanabe | 257/315 |

FOREIGN PATENT DOCUMENTS

CN 1885559 12/2006

* cited by examiner

*Primary Examiner*—Stephen W Smoot
(74) *Attorney, Agent, or Firm*—Jianq Chyun IP Office

(57) ABSTRACT

A memory device having a floating gate with a non-rectangular cross-section is disclosed. The non-rectangular cross-section may be an inverted T shape, a trapezoid shape, or a double inverted T shape. Methods are disclosed for producing a floating gate memory device having an improved coupling ratio due to an increased surface area of the floating gate. The memory device has a floating gate having a cross-sectional shape, such as an inverted T shape, such that a top contour is not a flat line segment.

11 Claims, 20 Drawing Sheets

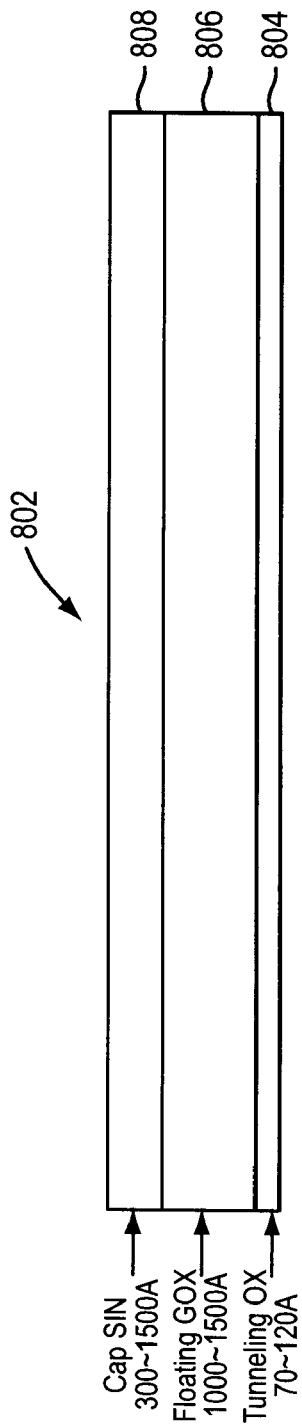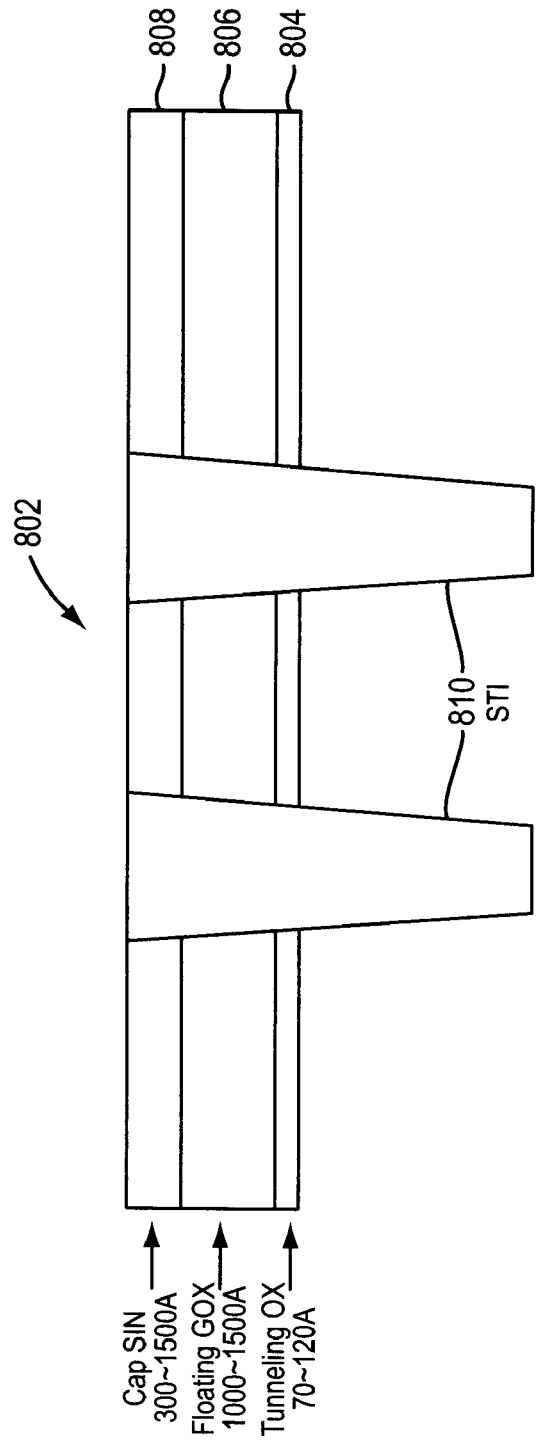
FIG. 8A
FIG. 8B

METHOD FOR FABRICATING INVERTED T-SHAPED FLOATING GATE MEMORY

COPYRIGHT NOTICE

A portion of the disclosure of this patent document contains material which may be subject to copyright protection. The copyright owner has no objection to the facsimile reproduction by anyone of the patent document or the patent disclosure as it appears in the Patent and Trademark Office patent file or records, but otherwise reserves all copyright rights.

TECHNICAL FIELD

The invention relates generally to non-volatile memory devices and, more particularly, an inverted T-shaped floating gate memory and method for fabricating the same.

BACKGROUND

Non-volatile memory devices have seen explosive growth with the advancement of electronic applications, such as memory cards, portable electronic devices, cell phones, MP3 players, digital still and video cameras, and other consumer electronics. Application requirements for low cost, power consumption, and high performance are driving memory design to different architectures. Floating gate structures continue to dominate non-volatile memory technology. These structures typically use polysilicon floating gates as the storage node and are arranged in various memory arrays to achieve architectures such as NAND flash and NOR flash memory. To program and erase a memory cell, tunneling methods are used to place charge carriers (i.e., electrons or holes) in the floating gate.

Floating gate transistors are commonly incorporated into non-volatile memory devices such as flash, EPROM, and EEPROM memory devices. For example, floating gate MOSFETs are commonly used in non-volatile memories. A floating gate MOSFET is composed of a MOSFET and one or more capacitors used to couple control voltages to the floating gate. A floating gate is a polysilicon gate surrounded by $SiO_2$. The floating gate may store charge because it is completely surrounded by a high-quality insulator. The charge on the floating gate may be modified, for example, by applying voltages to the source, drain, and control gate terminals to effect Fowler-Nordheim tunneling and hot carrier injection. To maximize efficiency for this type of memory storage, it is desirable to have a high coupling ratio for floating gate memory devices.

SUMMARY

According to one aspect of the invention, a memory device is disclosed that includes a plurality of memory cells, each memory cell including a floating gate having a cross-section cross-section that is one of an inverted T shape, U shape, a trapezoidal shape, and double inverted T shape.

According to another aspect of the invention, a method for forming a non-volatile memory device is disclosed. A substrate such as bare silicon is provided and a tunnel layer is formed over the substrate. A conductive layer, such as polysilicon, is formed over the tunnel layer. A portion of the conductive layer is removed such that a cross-section of the conductive layer forms a plurality of conductive structures. Each of the conductive structures has a top portion and a bottom portion and the top portion is narrower than the bottom portion. An insulator layer is formed over the conductive layer, and a conductive line is formed over the insulator layer.

According to another aspect of the invention, a method for forming a non-volatile memory device is disclosed. A substrate such as bare silicon is provided. A tunnel layer, a conductive layer, and a plurality of trenches are formed. The tunnel layer is on the substrate, the conductive layer is on the tunnel layer, and the trenches extend into the substrate to divide the substrate into a plurality of sections. The trenches are filled with a dielectric material to form a plurality of filled trench structures having sidewalls. Each of the sections of the conductive layer is bounded by two adjacent sidewalls. A portion of a section of the conductive layer is removed such that a cross-section of the section of the conductive layer forms an inverted T shape. An insulator layer is formed on the conductive layer, and a conductive line is formed over the insulator.

According to another aspect of the invention, a method of forming a memory device is disclosed. A tunnel layer is formed in a substrate, and a floating gate is formed over the tunnel layer. The floating gate has a cross-section that is one of an inverted T shape, a trapezoidal shape, and double inverted T shape.

According to another aspect of the invention, a method is disclosed for operating a memory device having a memory cell with a floating gate with a cross-section that is non-rectangular. A data bit is stored in the floating gate and the memory cell is controlled by a control gate. The disclosed method includes performing at least one of a program, erase, or read operation on a data bit stored in the floating gate by applying a voltage to the control gate.

BRIEF DESCRIPTION OF DRAWINGS

The foregoing summary, as well as the following detailed description, will be better understood when read in conjunction with the appended, exemplary drawings. It should be understood, however, that the invention is not limited to the precise arrangements and instrumentalities shown.

FIGS. 8A-I illustrate a method for forming a non-volatile memory device having an inverted T-shaped floating gate according to another embodiment of the present invention.

DETAILED DESCRIPTION

Reference will now be made in detail to the exemplary embodiments of the invention, examples of which are illustrated in the accompanying drawings. Wherever possible, the same reference numbers will be used throughout the drawings to refer to the same. The following examples disclose a memory device that uses a floating gate with a unique shape that provides a high coupling ratio for a floating gate structure. According to one example, the floating gate structure has an inverted T shaped, described in further detail below.

Figure 1:
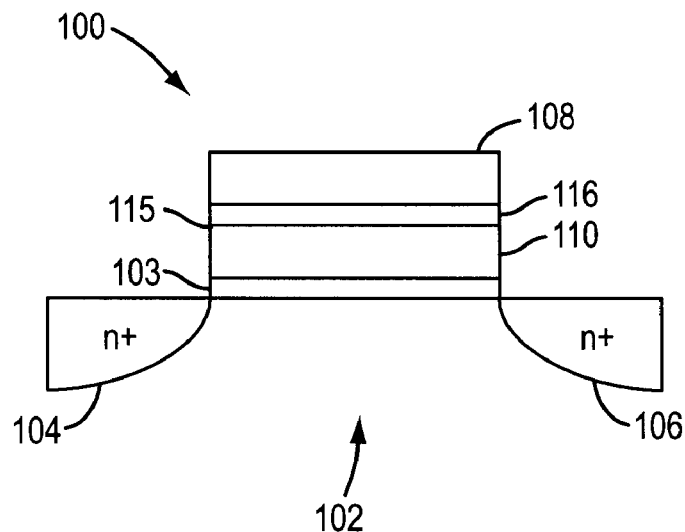
FIG. 1 illustrates a conventional floating gate transistor.

FIG. 1 illustrates a conventional floating gate transistor 100. Floating gate transistor 100 is formed on substrate 102 and comprises tunnel oxide layer 103, source 104, drain 106, control gate 108, and floating gate 110. Floating gate 110 has a cross-section that is a rectangular shape, and a top contour 115. A dielectric layer 116 is disposed between floating gate 110 and control gate 108. In conventional floating gate transistor 100, the voltage $V_{FG}$ at the floating gate 110 is given by the following equation:

$$V_{FG} = \frac{C_{gate}}{C_{total}} V_G + \frac{C_{source}}{C_{total}} V_S + \frac{C_{drain}}{C_{total}} V_D + \frac{C_{sub}}{C_{total}} V_{sub} \quad (1)$$

where $C_{gate}$ and $V_G$ are the capacitance and voltage at the control gate 108, respectively, $C_{source}$ and $V_S$ are the capacitance and voltage at the source 104, $C_{drain}$ and $V_D$ are the capacitance and voltage at the drain 106, and $C_{Sub}$ and $V_{sub}$ are the capacitance and voltage at the substrate 102. When substrate 102, source 104, and drain 106 are grounded, Eq. 1 reduces to the following:

$$V_{FG} = \frac{C_{gate}}{C_{total}} V_G \quad (2)$$

The first term on the right hand side of Eq. 2 is known as the coupling ratio, and it is desirable to have a high coupling ratio, e.g., 0.6. The capacitance at the gate $C_{gate}$ is given by the following relationship:

$$C_{gate} = \varepsilon \frac{A}{d} \quad (3)$$

where $\in$ is the dielectric constant, A is the surface area between the control gate 108 and the floating gate 110, and d is the distance between the control gate 108 and the floating gate 110. One can increase the coupling ratio by varying one or more of these three variables. In other words, increasing the dielectric constant, increasing the cross-sectional area, or decreasing the distance will result in a higher coupling ratio.

The following examples of the present invention disclose techniques for increasing the cross-sectional area using a novel inverted T-shaped floating gate. For example, the surface area A between the control gate and the floating gate is related to the peripheral length of the top contour of the floating gate. By changing the cross-sectional profile of the floating gate 110 from a rectangle to an inverted T shape, the peripheral length of the top contour is increased, and the surface area between the control gate 108 and the floating gate can be also be increased. For example, if the layer defining the top contour for the inverted T shape gate is stretched out flat it would have a longer length than the top contour of a rectangular shaped gate having the same width, due to the staircase contour.

Figure 2:
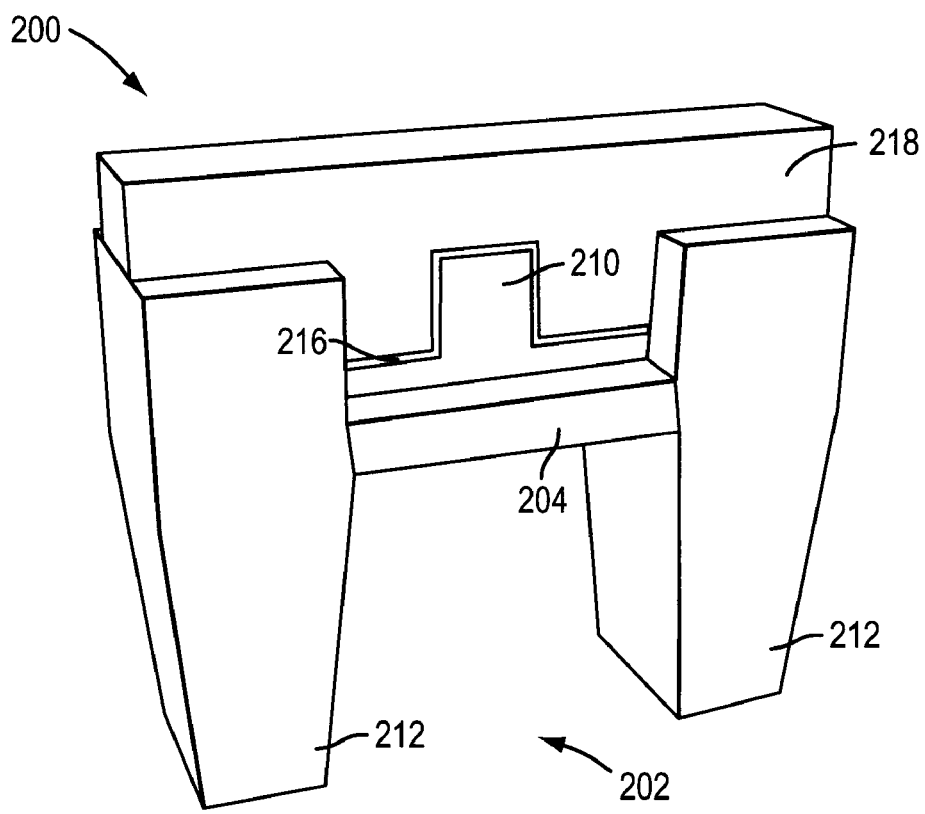
FIG. 2 illustrates a non-volatile memory device structure having an increased coupling ratio that includes an inverted T-shaped floating gate according to one embodiment of the present invention.

FIG. 2 illustrates a non-volatile memory device structure having an increased coupling ratio that includes an inverted T-shaped floating gate according to one example of the present invention. Non-volatile memory device structure 200 comprises substrate 202, tunnel oxide layer 204, inverted T-shaped floating gate 210, shallow trench isolation (STI) trenches 212, interpoly dielectric layer 216, and word line layer 218, which functions as a control gate. STI trenches 212 effectively separate a plurality of memory cell regions. As is readily apparent, the inverted T-shaped floating gate 210 has a top contour that would have a longer peripheral length as compared to a floating gate having a rectangular cross-section. In other words, there is more surface area with the inverted T shape gate to create a larger capacitance, thereby increasing the coupling ratio as compared to a device with a floating gate having a rectangular cross-section.

Alternatively, other cross-sectional shapes may be used for a floating gate to increase capacitance and the coupling ratio. A U-shaped floating gate, a trapezoidal-shaped floating gate, and a double inverted T-shaped floating gate are just some examples. In general, a floating gate having a cross-sectional profile such that the top contour is not a flat line segment may be used to increase the coupling ratio. Although in this case, the top contour of the floating gate 210 forms an interface with the word line 218, it will be readily appreciated by one skilled in the art that other orientations between the floating gate 210 and the word line 218 may be used, so that the "top" contour may become the "bottom" contour or a "side" contour. Also, a plurality of memory cells having the non-volatile memory device structure 200 or similar structure may be arranged in one or more arrays to form a non-volatile memory device, with a plurality of word lines and bit lines (not shown) coupled to the floating gates and control gates of the individual memory cells.

Figure 3:
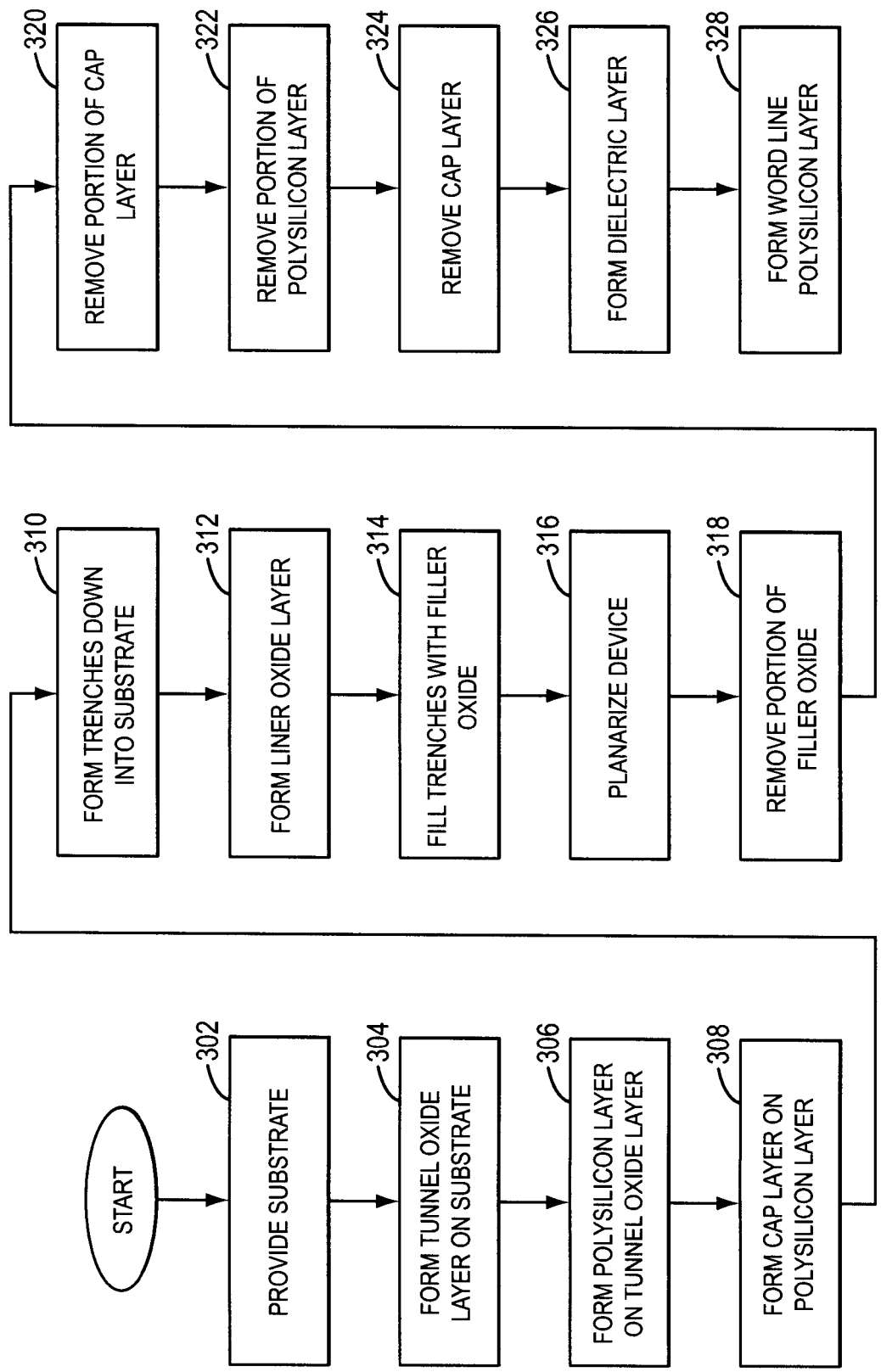
FIG. 3 is a flow diagram illustrating a method for forming a non-volatile memory device having an inverted T-shaped floating gate according to one embodiment of the present invention.

FIG. 3 is a flow diagram illustrating a method 300 for forming a non-volatile memory device having an inverted T-shaped floating gate according to one embodiment of the present invention. A substrate is provided, step 302. For example, a bare silicon substrate is provided. A tunnel oxide layer is formed on the substrate, step 304. The tunnel oxide may be, for example, $SiO_2$. A polysilicon layer is formed on the tunnel oxide layer, step 306. A cap layer is formed on the polysilicon layer, step 308. The cap layer may be, for example, a silicon nitride layer. The cap layer is patterned and a shallow trench isolation (STI) process forms trenches extending down into the substrate, step 310. For example, a mask may be selectively applied to the cap layer to form a first plurality of masked regions and a first plurality of non-masked regions. The STI process forms trenches extending down into the substrate in the first plurality of non-masked regions. The trenches effectively separate a plurality of memory cell regions. An optional liner oxide layer is formed, step 312. The trenches are filled with a filler oxide, step 314. A chemical mechanical polishing (CMP) process is performed, step 316, to planarize the device. The filler oxide is etched back, step 318. For example, a wet etch process may be used, such as using hot phosphoric acid (HPA). Alternatively, a dry etch process may be used. A portion of the cap layer is removed, step 320, to expose a part of the polysilicon layer such that a cross-section of the cap layer and the polysilicon layer forms a plurality of inverted T shapes. For example, the cap layer may be patterned to form a second plurality of masked regions and a second plurality of non-masked regions on the cap layer and a wet etch process may etch down to the polysilicon layer. Alternatively, a dry etch process may be used. A portion of the polysilicon layer is removed, step 322, such that a cross-section of the polysilicon layer forms a plurality of inverted T shapes. For example, a dry etch process may be used to etch partially through the polysilicon layer. The cap layer is removed, step 324. An inter-poly dielectric layer is formed on the polysilicon layer and the filler oxide layer, step 326. A polysilicon layer (word line) is formed over the inter-poly dielectric layer, step 328.

Figure 4A:
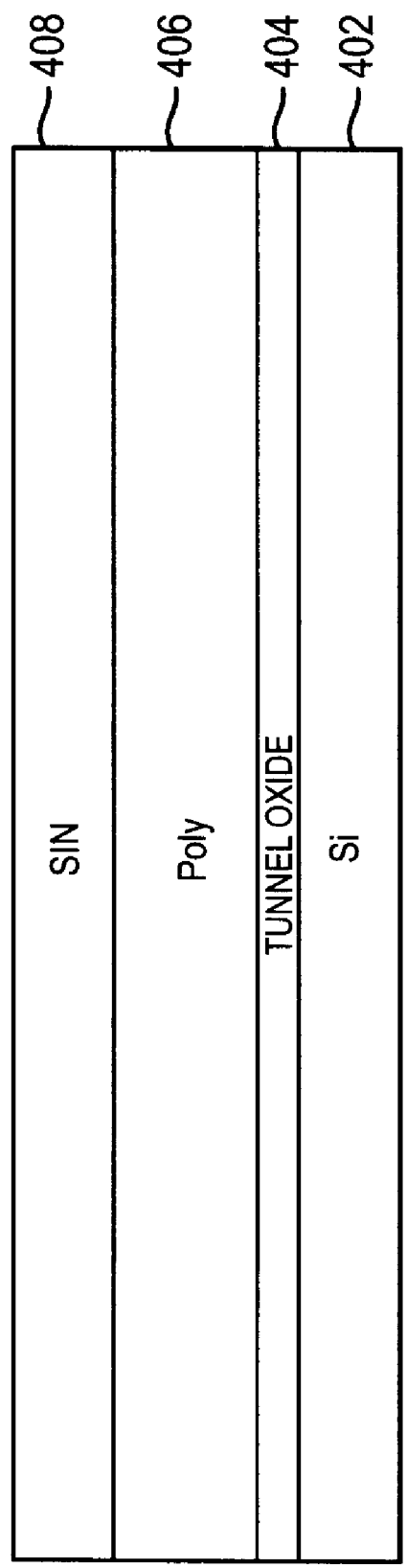
FIGS. 4A-D illustrate a method for forming a non-volatile memory device having an inverted T-shaped floating gate according to one embodiment of the present invention.

FIGS. 4A-4D illustrate the method 300 of FIG. 3 for forming of a non-volatile memory device having an inverted T-shaped floating gate according to one embodiment of the present invention. In FIG. 4A, a tunnel oxide layer 404 has been formed on substrate 402. Substrate 402 may be, for example, bare silicon. Tunnel oxide layer 404 may be, for example, $SiO_2$. Polysilicon layer 406 has been formed on tunnel oxide layer 404. Cap layer 408 has been formed on polysilicon layer 406 and may be, for example, silicon nitride.

Figure 4B:
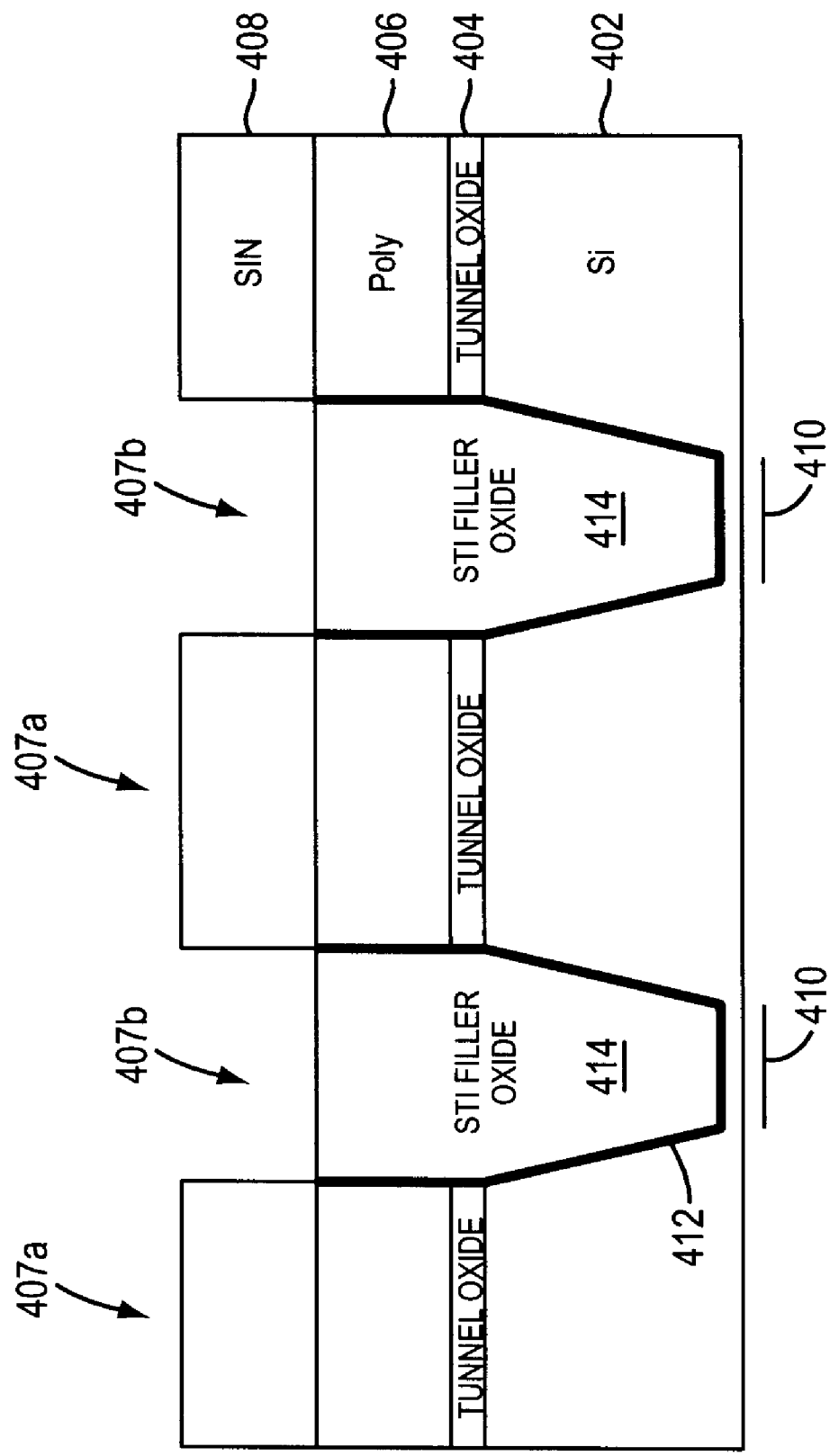

In FIG. 4B, a plurality of trenches 410 has been formed extending down through the cap layer 408, the polysilicon layer 406, the tunnel oxide layer 404, and into the substrate 402. For example, a mask layer (not shown) may be selectively applied to the cap layer 408 to create a first plurality of masked regions 407a and a first plurality of non-masked regions 407b. The trenches 410 may be formed, for example, in the non-masked regions 407b using a shallow trench isolation (STI) process. The trenches effectively separate a plurality of memory cell regions. The trenches 410 have been lined with a liner oxide 412 and filled with a filler oxide 414. Liner oxide 412 may be formed, for example, by an in-situ steam growth (ISSG) or thermal process. Alternatively, liner oxide 412 may be omitted. Filler oxide 414 may be formed, for example, by a high-density plasma (HDP) deposition process. A chemical mechanical polishing (CMP) step has been performed in order to expose the cap layer 408. The filler oxide 414 has been etched back in order to expose the sidewall of the cap layer 408 without vertical loss in the cap layer 408.

Figure 4C:
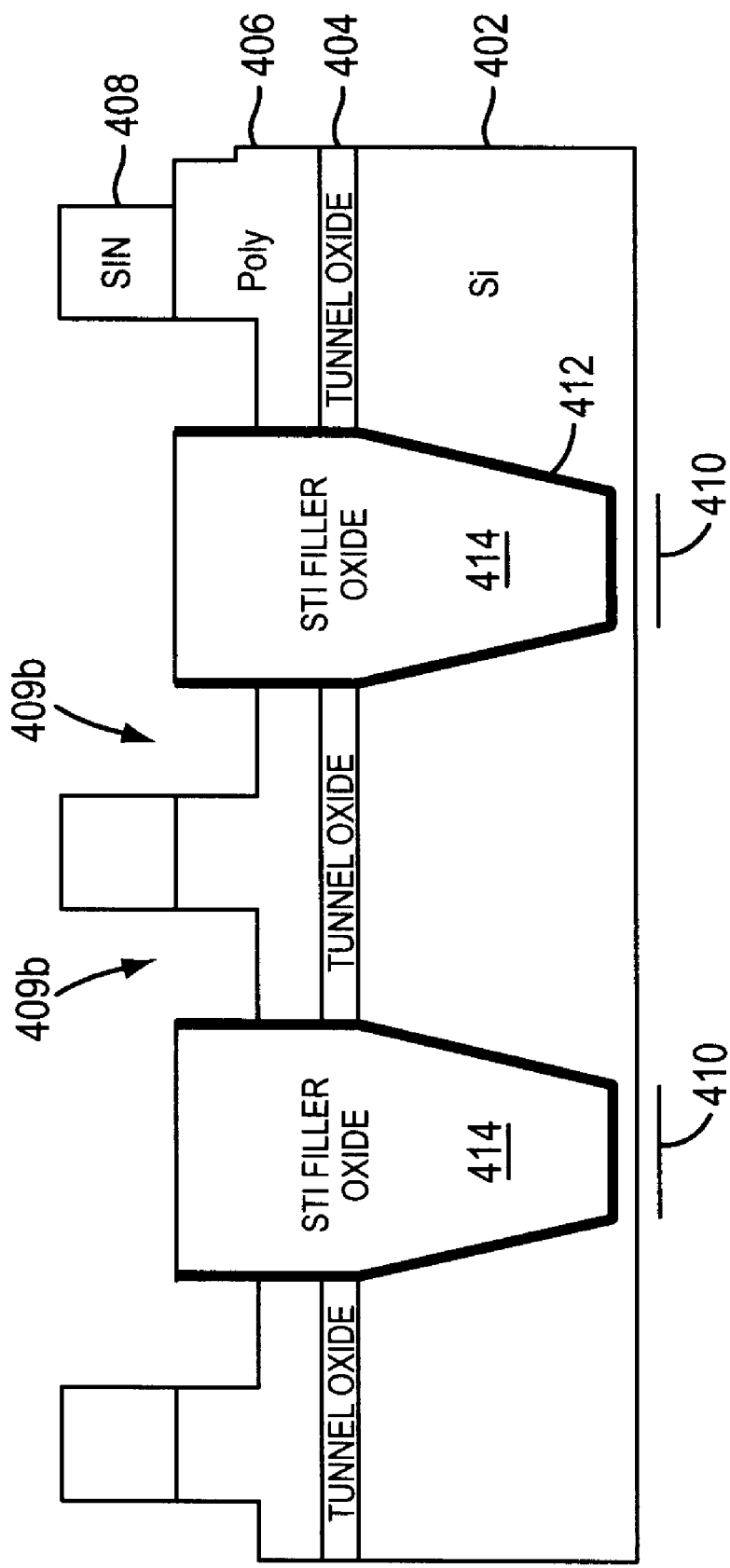

In FIG. 4C, a portion of the cap layer 408 has been removed to expose a portion of the polysilicon layer 406 such that the cross-section of the cap layer 408 and the polysilicon layer 410 forms a plurality of inverted T shapes. The cap layer 408 may be etched using a high-selectivity solvent such as, for example, hot phosphoric acid (HPA). Alternatively, a dry etch process without additional mask may be used. A portion of the exposed part of the polysilicon layer 406 in the second plurality of non-masked regions 409b has then been removed such that the cross-section of the polysilicon layer 406 forms a plurality of inverted T shapes. The portion of the exposed part of the polysilicon layer 406 may be removed, for example, using a dry etch process.

Figure 4D:
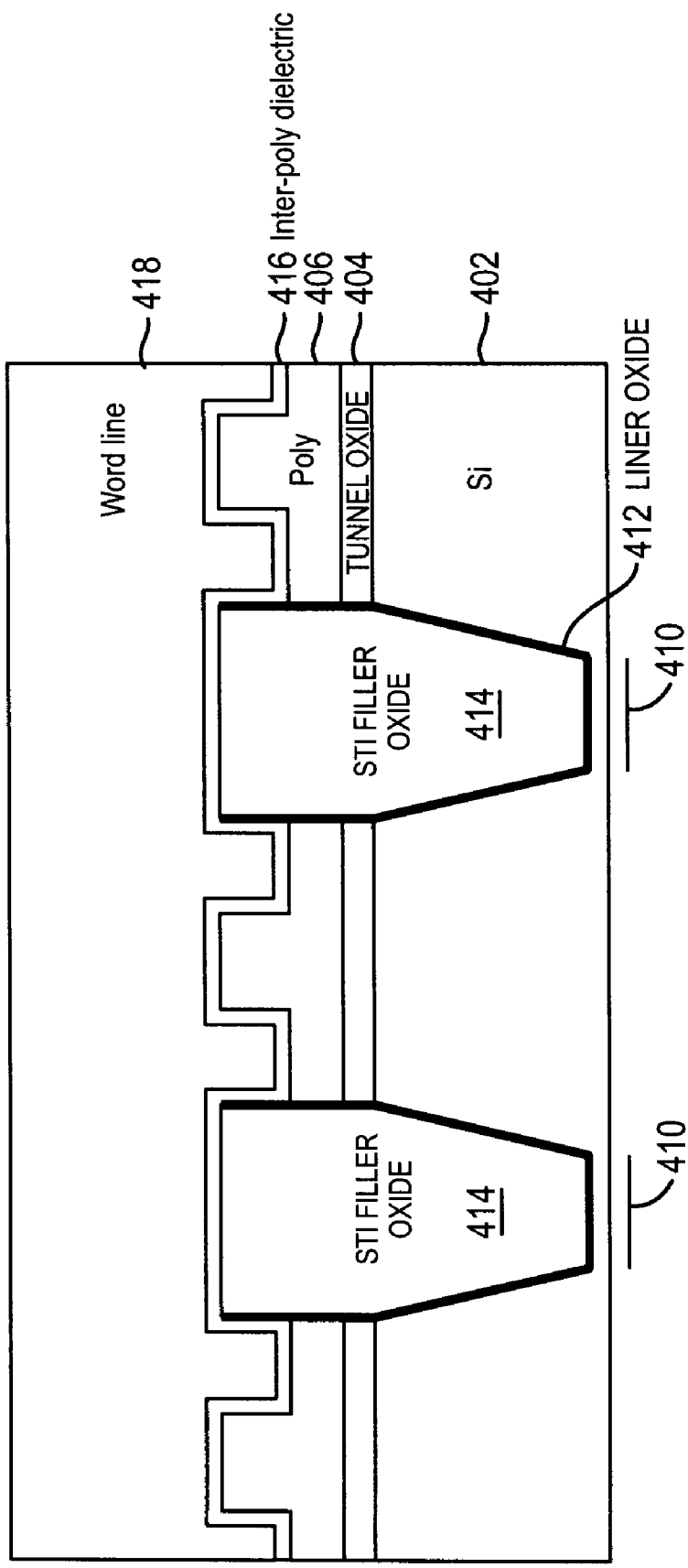

In FIG. 4D, an inter-poly dielectric layer 416 has been formed on the polysilicon layer 406, the liner oxide layer 412, and the filler oxide 414. A word line (e.g., polysilicon) layer 418 has been formed on the inter-poly dielectric layer 416.

Figure 5:
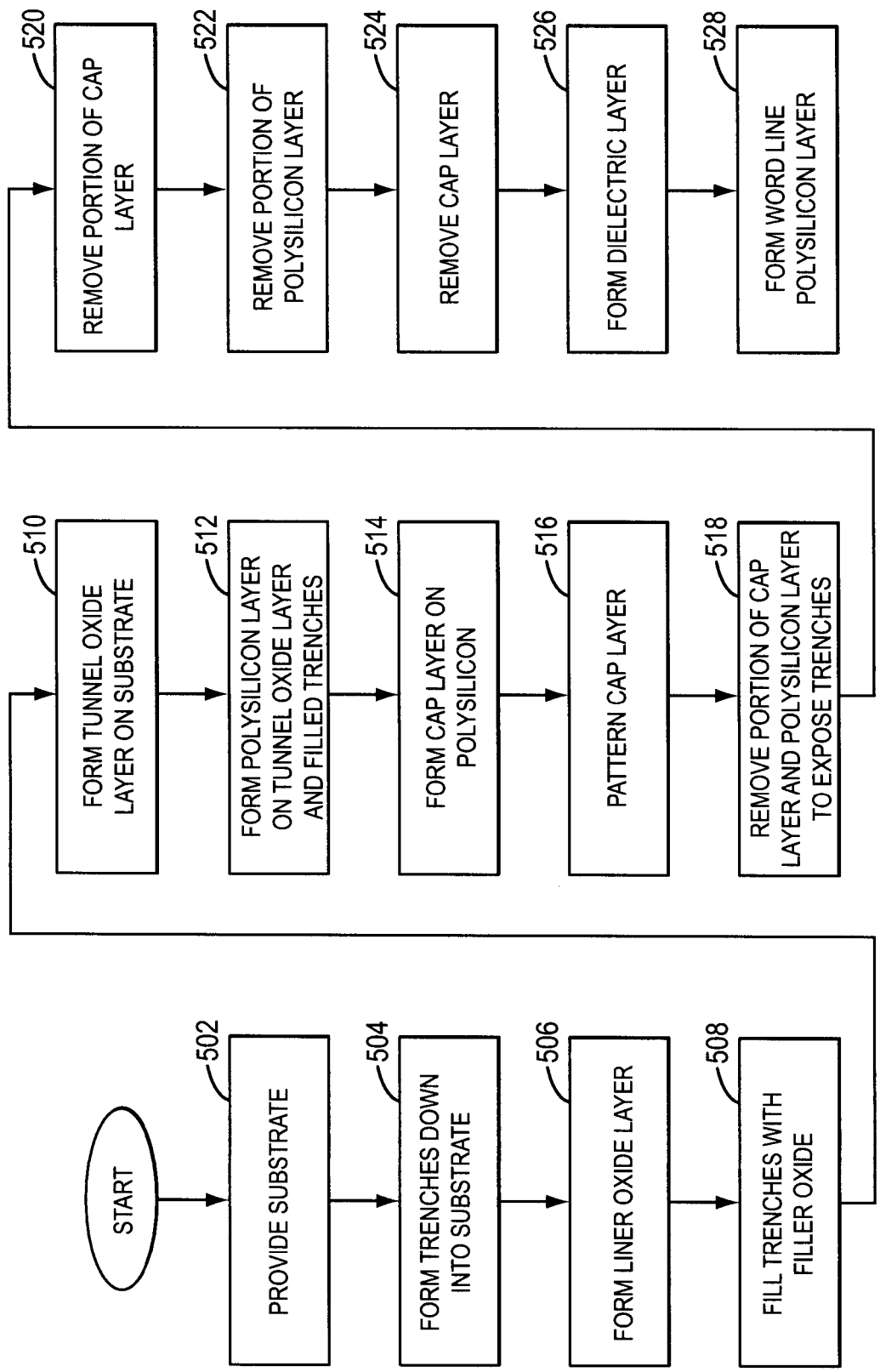
FIG. 5 is a flow diagram illustrating a method for forming a non-volatile memory device having an inverted T-shaped floating gate according to another embodiment of the present invention.

FIG. 5 is a flow diagram illustrating a method 500 for forming a non-volatile memory device having an inverted T-shaped floating gate according to another embodiment of the present invention. A substrate is provided, step 502. For example, a bare silicon substrate is provided. A plurality of trenches extending down into the substrate are formed, step 504. For example, a shallow trench isolation (STI) process forms trenches extending down into the substrate. The trenches effectively separate a plurality of memory cell regions. The trenches are lined with an optional liner oxide layer, step 506. The liner oxide layer may be formed, for example, by an ISSG or thermal process. The trenches are then filled with a filler oxide, step 508. The filler oxide may be formed, for example, by a HDP deposition process. A tunnel oxide layer is formed on the substrate, step 510. The tunnel oxide may be, for example, a furnace oxide, and is formed on the substrate in between the filled trenches. A chemical mechanical polishing (CMP) process may be used to planarize the device. A polysilicon layer is formed on the tunnel oxide layer and the filled trenches, step 512. A cap layer is formed on the polysilicon layer, step 514. The cap layer may be, for example, a silicon nitride layer. The cap layer is patterned, step 516. For example, a mask layer may be selectively applied to the cap layer to form a first plurality of masked regions and a first plurality of non-masked regions. The non-masked regions correspond, for example, to the regions above the filled trenches. A portion of the cap layer and a portion of the polysilicon later are removed to expose the filled trenches, step 518. For example, a plasma etch process may be used to remove a portion of the cap layer and a portion of the polysilicon layer in the first plurality of non-masked regions, thereby exposing the filler oxide layer. Alternatively, a dry etch process may be used to remove the portion of the cap layer and the portion of the polysilicon layer above the filled trenches. A portion of the cap layer is removed, step 520, to expose a part of the polysilicon layer such that a cross-section of the cap layer and the polysilicon layer forms a plurality of inverted T shapes. For example, a mask layer may be selectively applied to the cap layer to form a second plurality of masked regions and a second plurality of non-masked regions and a wet etch process, with high selectivity for the cap layer, may be used to remove a portion of the cap layer to expose a portion of the polysilicon layer. Alternatively, a dry etch process may be used. A portion of the polysilicon layer is removed, step 522, such that a cross-section of the polysilicon layer forms a plurality of inverted T shapes. For example, a dry etch process may be used to etch partially through the polysilicon layer. The cap layer is removed, step 524. An inter-poly dielectric layer is formed on the polysilicon layer and the filler oxide layer, step 526. The dielectric layer may be, for example, an ONO layer. A polysilicon (word line) layer is formed over the inter-poly dielectric layer, step 528.

FIGS. 6A-D illustrate the method 500 of FIG. 5 for forming a non-volatile memory device having an inverted T-shaped floating gate according to another embodiment of the present invention.

Figure 6A:
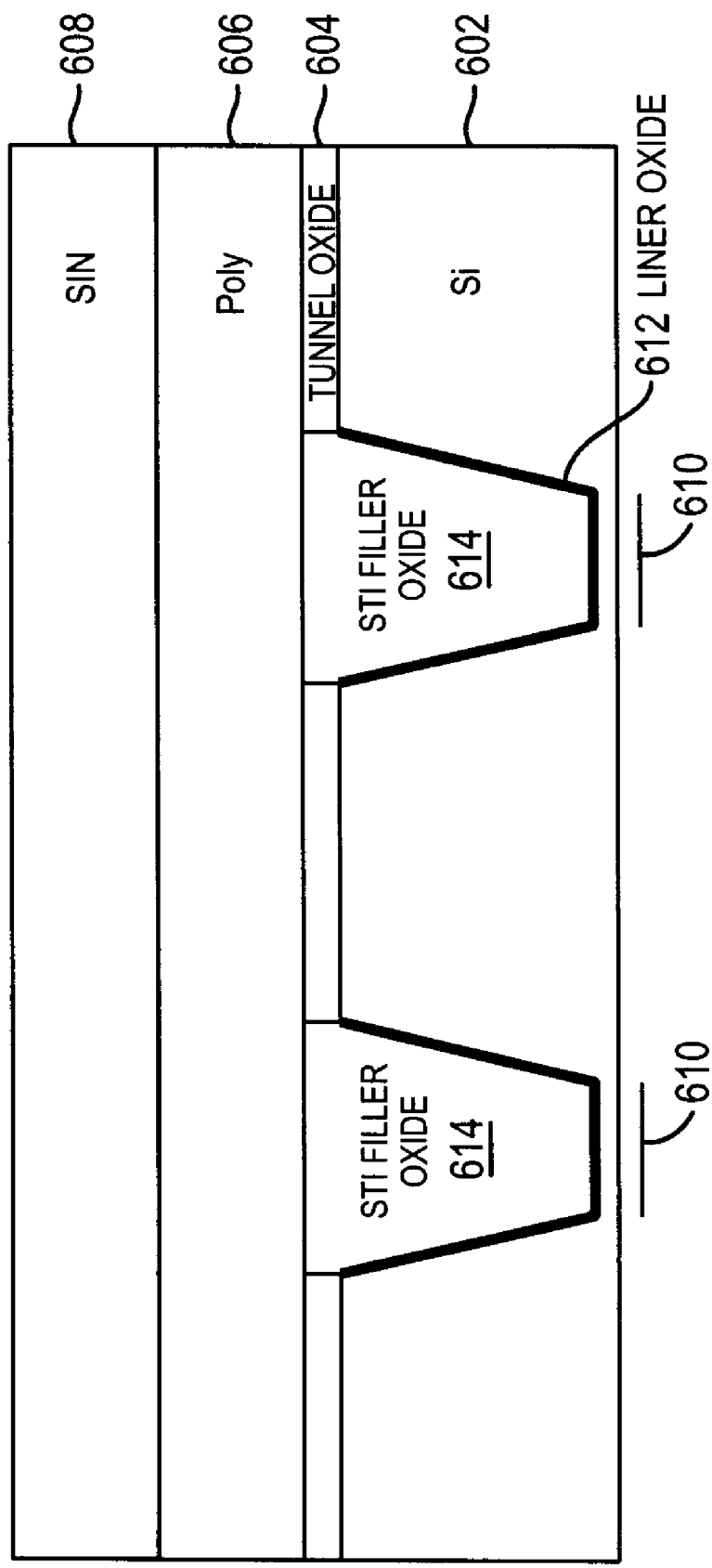
FIGS. 6A-D illustrate a method for forming a non-volatile memory device having an inverted T-shaped floating gate according to another embodiment of the present invention.

In FIG. 6A, a substrate 602 has been provided. The substrate 602 may be, for example, bare silicon. A plurality of trenches 610 extending down into the substrate 602 have been formed, lined with an optional liner oxide 612, and filled with a filler oxide 614. The trenches 610 may be formed, for example, using a shallow trench isolation (STI) process. The trenches effectively separate a plurality of memory cell regions. The liner oxide 612 may be formed, for example, by an ISSG or thermal process. The filler oxide 614 may be formed, for example, by a HDP deposition process. A tunnel oxide layer 604 has been formed on the substrate 602 in between the trenches 610. The tunnel oxide layer may be, for example, a furnace oxide. A polysilicon layer 606 has been formed on the tunnel oxide layer 604 and the filler oxide layer 614. A cap layer 608 has been formed on the polysilicon layer 606. The cap layer 608 may be, for example, silicon nitride.

Figure 6B:
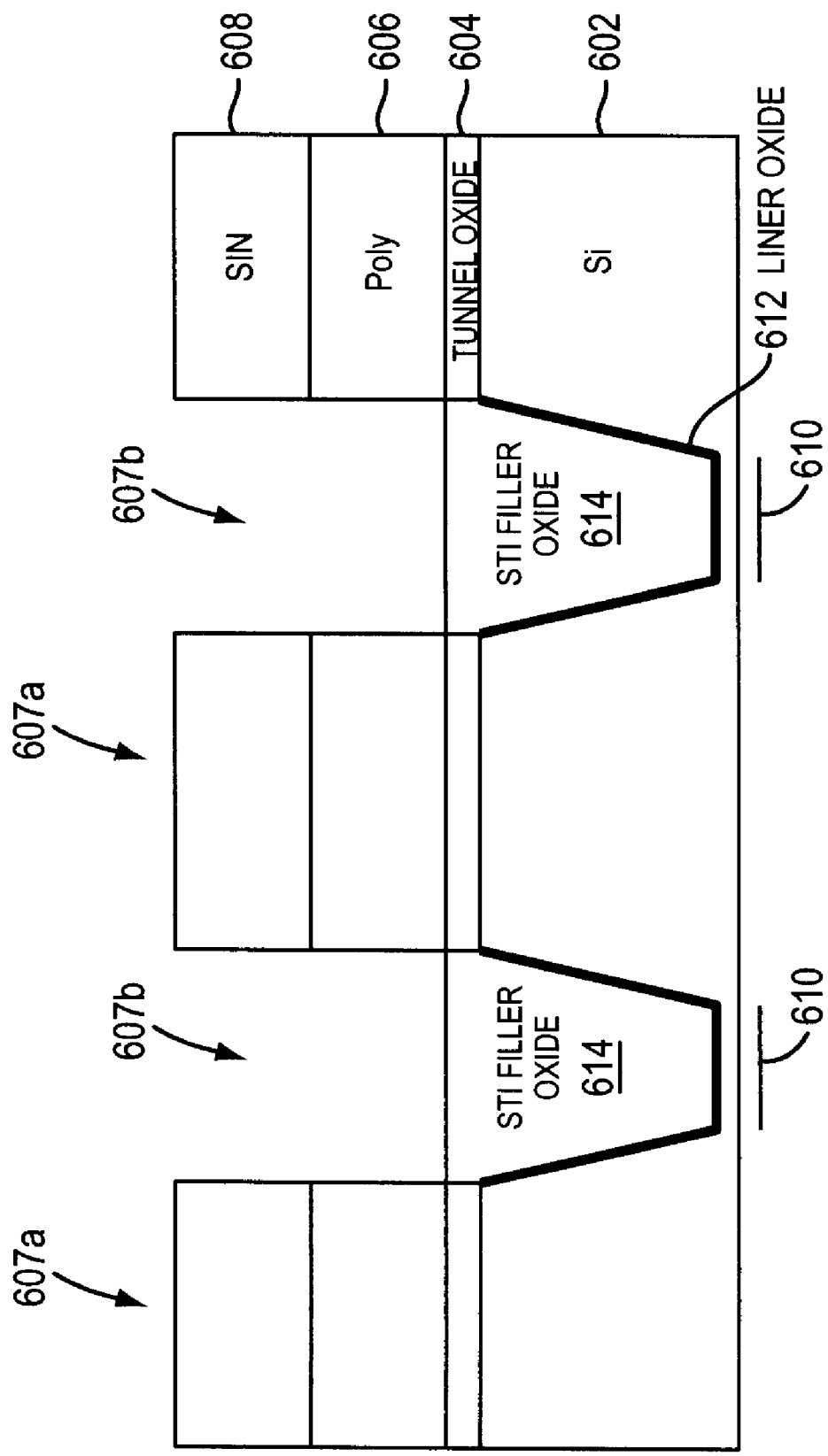

In FIG. 6B, a portion of the cap layer 608 and the polysilicon layer 606 has been removed to expose the filler oxide layer 614. For example, a mask layer (not shown) may be selectively applied to the cap layer 608 to form a first plurality of masked regions 607a and a first plurality of non-masked regions 607b. The non-masked regions 607b correspond, for example, to the regions above the filled trenches 610. A dry etch process may be used, for example, to remove a portion of the cap layer 608 in the first plurality of non-masked regions 607b and a portion of the polysilicon layer 606 in the first plurality of non-masked regions 607b, thereby exposing the filler oxide layer 614.

Figure 6C:
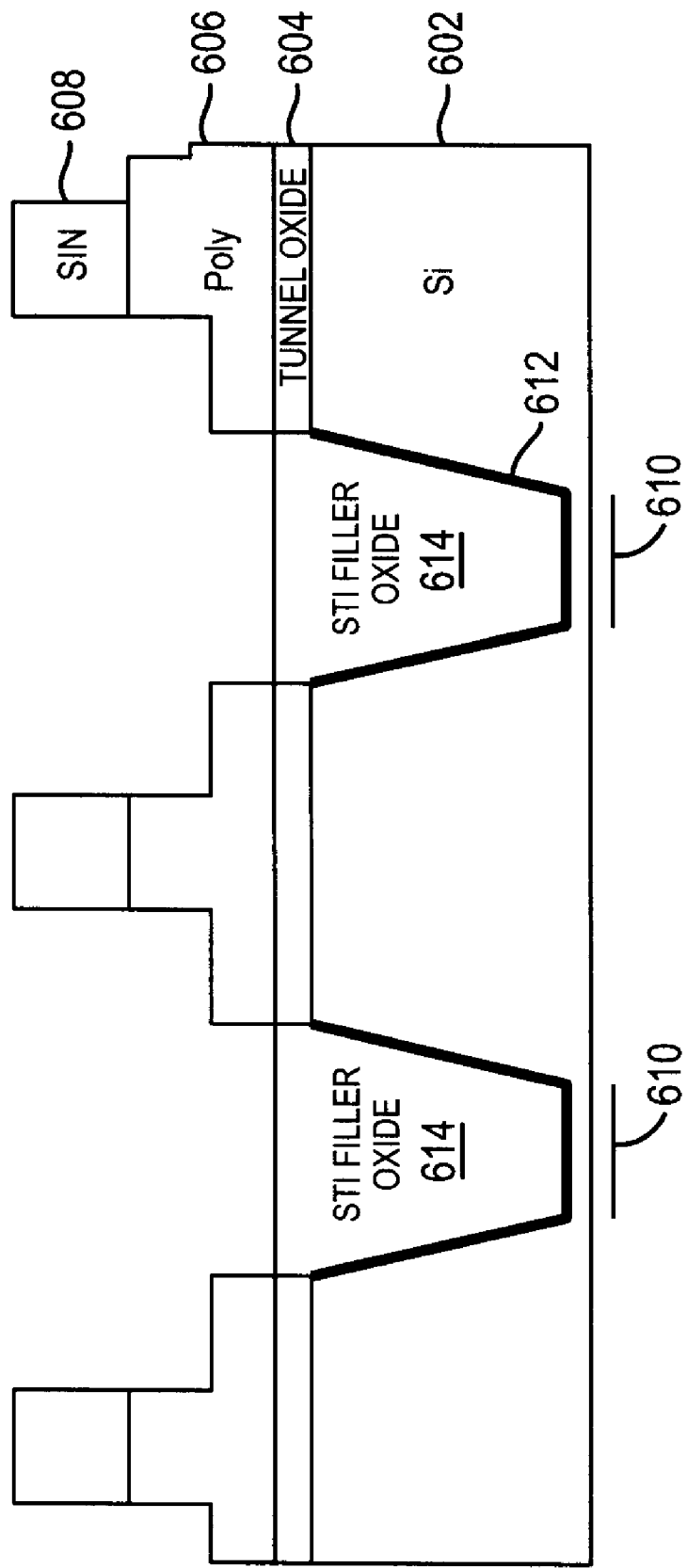

In FIG. 6C, a portion of the cap layer 608 has been removed to expose part of the polysilicon layer 606 such that a cross-section of the cap layer 608 and the polysilicon layer 606 forms a plurality of inverted T shapes. A wet etch process, with high selectivity for the cap layer 608, is used to remove a portion of the cap layer 608 to expose a portion of the polysilicon layer 606. Alternatively, a dry etch process may be used. A portion of the polysilicon layer 606 has been removed such that a cross-section of the polysilicon layer forms a plurality of inverted T shapes. For example, a dry etch process may be used to etch partially through the polysilicon layer 606.

Figure 6D:
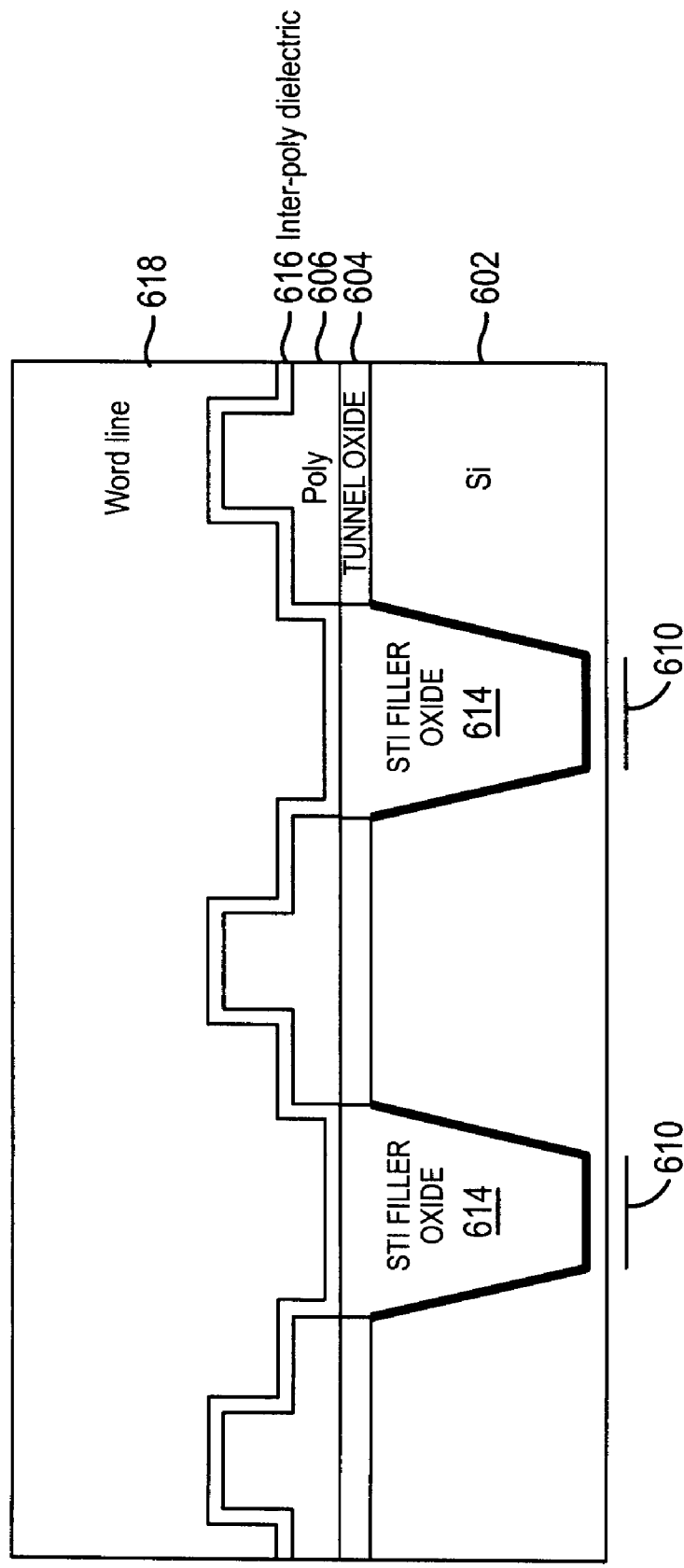

In FIG. 6D, the cap layer 608 has been removed. A dielectric layer 616 has been formed on the polysilicon layer 606 and the filler oxide layer 614. The dielectric layer 616 may be, for example, an ONO layer. A polysilicon (word line) layer 618 has been formed over the dielectric layer 616.

Figure 7:
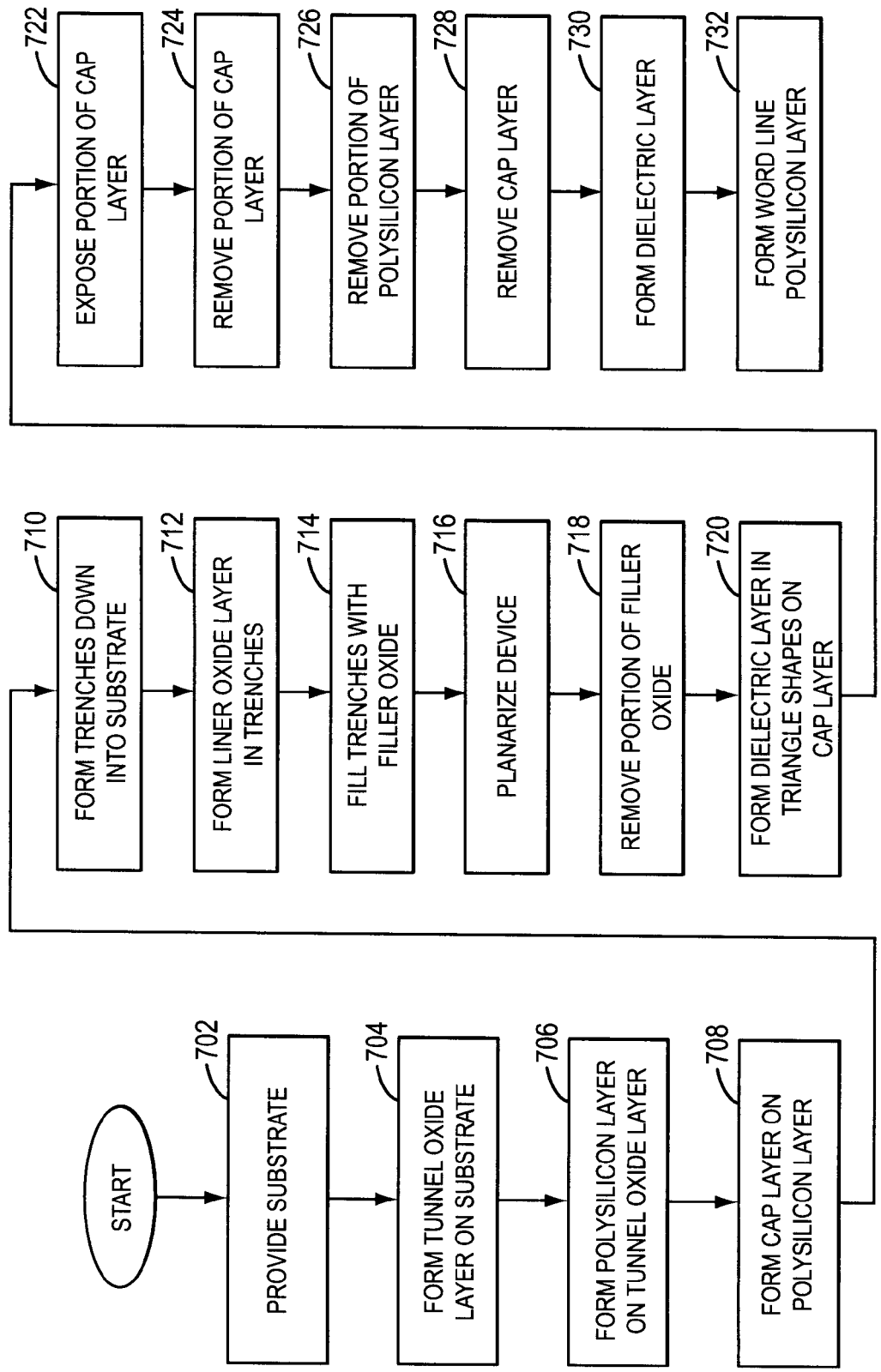
FIG. 7 is a flow diagram illustrating a method for forming a non-volatile memory device having an inverted T-shaped floating gate according to another embodiment of the present invention.

FIG. 7 is a flow diagram illustrating a method 700 for forming a non-volatile memory device having an inverted T-shaped floating gate according to another embodiment of the present invention. A substrate is provided, step 702. For example, a bare silicon substrate is provided. A tunnel oxide layer is formed on the substrate, step 704. The tunnel oxide may be, for example, a furnace oxide. A polysilicon layer is formed on the tunnel oxide layer, step 706. A cap layer is formed on the polysilicon layer, step 708. The cap layer may be, for example, a silicon nitride layer. The cap layer is patterned and a shallow trench isolation (STI) process forms trenches extending down into the substrate, step 710. For example, a mask may be selectively applied to the cap layer to form a first plurality of masked regions and a first plurality of non-masked regions. The STI process forms trenches extending down into the substrate in the first plurality of non-masked regions. The trenches effectively separate a plurality of memory cell regions. An optional liner oxide layer is formed, step 712. The trenches are filled with a filler oxide, step 714. A chemical mechanical polishing (CMP) process is performed, step 716, to planarize the device. A portion of the filler oxide is removed, step 718. Photolithography and etching may be used. For example, a buffered oxide etch (BOE) process using hydrofluoric (HF) acid may be used to etch down the filler oxide. Alternatively, a dry etch process may be used. A dielectric layer is formed in triangle shapes on the cap layer, step 720. For example, a dielectric layer may be formed by a high density plasma chemical vapor deposition process (HDP-CVD). A similar process for forming triangle shapes is described in commonly-assigned U.S. Pat. No. 6,380,068, which is incorporated by reference. The dielectric layer may be, for example, an oxide formed by a HDP deposition process. The triangle shapes effectively form a second plurality of masked regions and a second plurality of non-masked regions of the cap layer. A portion of the cap layer is exposed, step 722. For example, a HDP dip process may be used to expose a portion of the cap layer in the second plurality of non-masked regions. A portion of the cap layer is removed, step 724, to expose a part of the polysilicon layer such that a cross-section of the cap layer and the polysilicon layer forms a plurality of inverted T shapes. For example, a wet etch process, with a high etching selectivity ratio between the cap layer and the polysilicon layer, may etch the cap layer in the second plurality of non-masked regions down to the polysilicon layer. Alternatively, a dry etch process may be used. A portion of the polysilicon layer is removed, step 726, such that a cross-section of the polysilicon layer forms a plurality of inverted T shapes. For example, a wet etch process may be used to partially etch through the exposed polysilicon layer. Alternatively, a dry etch process may be used. The cap layer is removed, step 728. For example, a cap layer of silicon nitride may be removed by a dip in phosphoric acid ($H_3PO_4$), which also removes the dielectric layer triangle shapes. A dielectric layer is formed on the polysilicon layer and the filler oxide layer, step 730. A polysilicon (word line) layer is formed on the dielectric layer, step 732.

FIGS. 8A-8I illustrate the method 700 of FIG. 7 for forming a non-volatile memory device having an inverted T-shaped floating gate according to another embodiment of the present invention.

In FIG. 8A, a substrate 802 has been provided. Substrate 802 may be, for example, bare silicon. A tunnel oxide layer 804 has been formed on substrate 802. The tunnel oxide layer may be, for example, a furnace oxide. A polysilicon layer 806 has been formed on tunnel oxide layer 804. A cap layer 808 has been formed on the polysilicon layer. The cap layer 808 may be, for example, silicon nitride.

In FIG. 8B, a plurality of trenches 810 have been formed extending down through the cap layer 808, the polysilicon layer 806, the tunnel oxide layer 804, and down into the substrate 802. The trenches 810 may be formed, for example, using a shallow trench isolation (STI) process. The trenches effectively separate a plurality of memory cell regions. The trenches 810 may be lined with an optional liner oxide layer 812 (not shown). Liner oxide layer 812 may be formed, for example, by an ISSG or thermal process. The trenches 810 are filled with a filler oxide 814. Filler oxide 814 may be formed, for example, by a HDP deposition process. The device may be planarized, for example, by a chemical mechanical polishing (CMP) process.

Figure 8C:
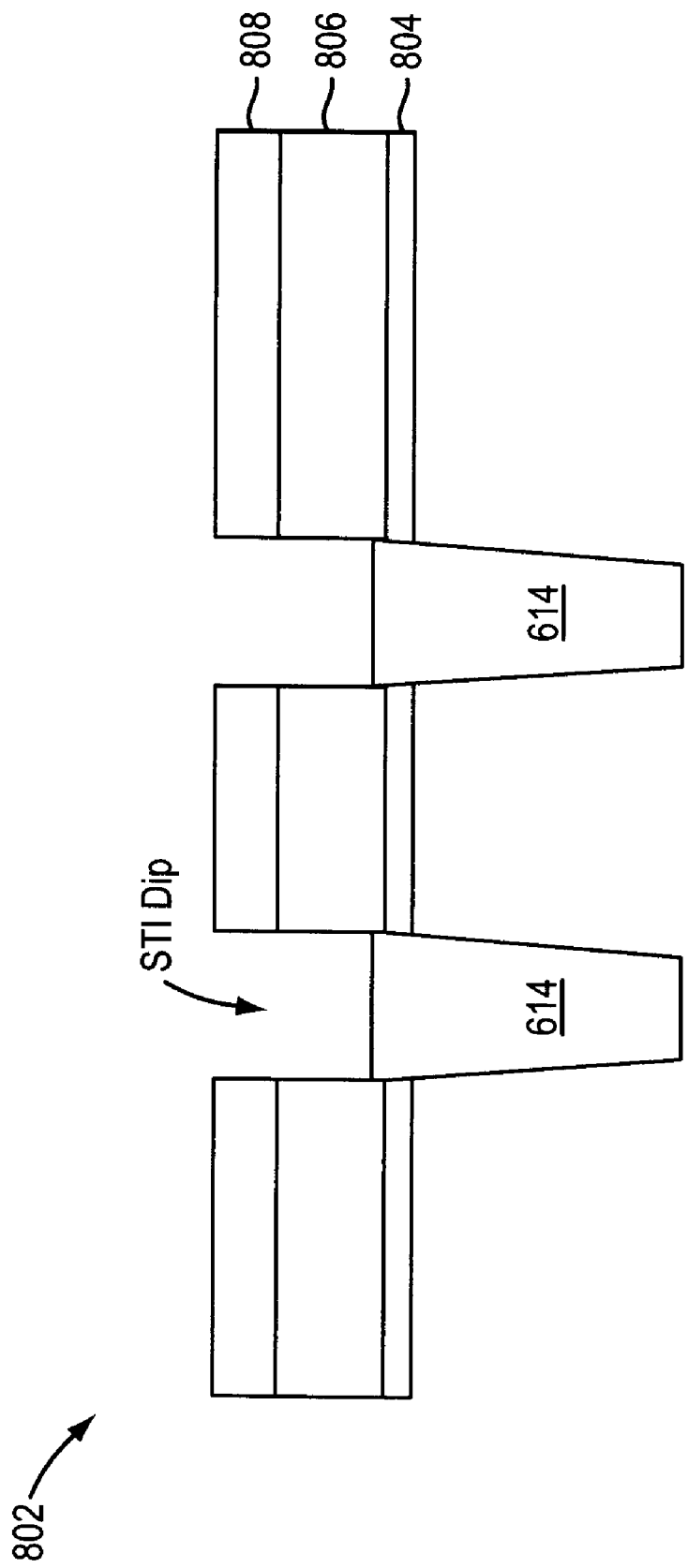

In FIG. 8C, filler oxide 814 has been partially etched back. For example, a buffered oxide etch (BOE) process using hydrofluoric (HF) acid may be used. Alternatively, a dry etch process may be used.

Figure 8D:
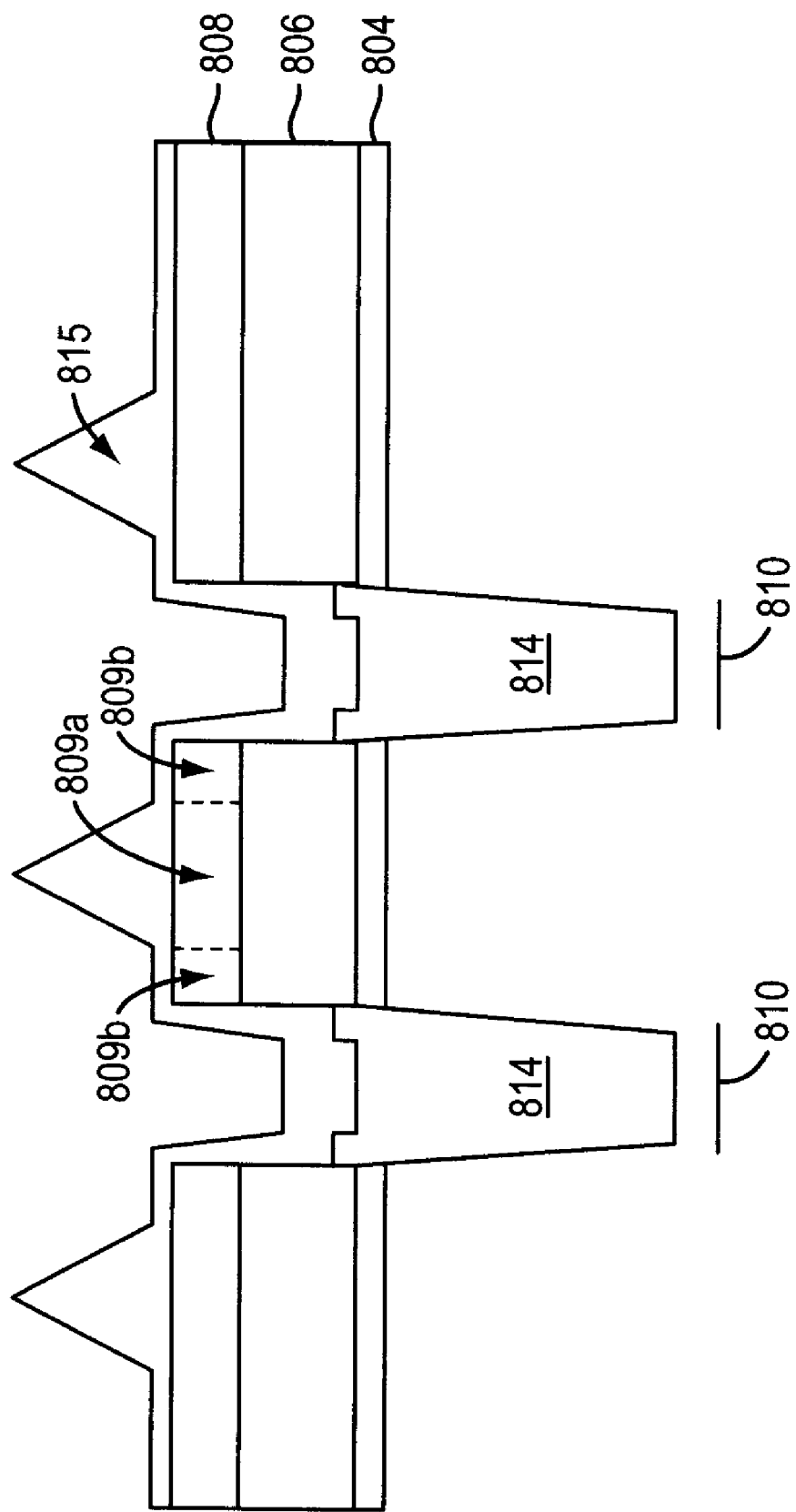

In FIG. 8D, a dielectric layer 815 has been formed in triangle shapes on the cap layer 808. For example, the dielectric layer 815 may be formed by a high density plasma chemical vapor deposition process (HDP-CVD). The dielectric layer 815 may be, for example, an oxide formed by a HDP deposition process. The triangle shapes effectively form a plurality of masked regions 809a and a plurality of non-masked regions 809b of the cap layer 808.

Figure 8E:
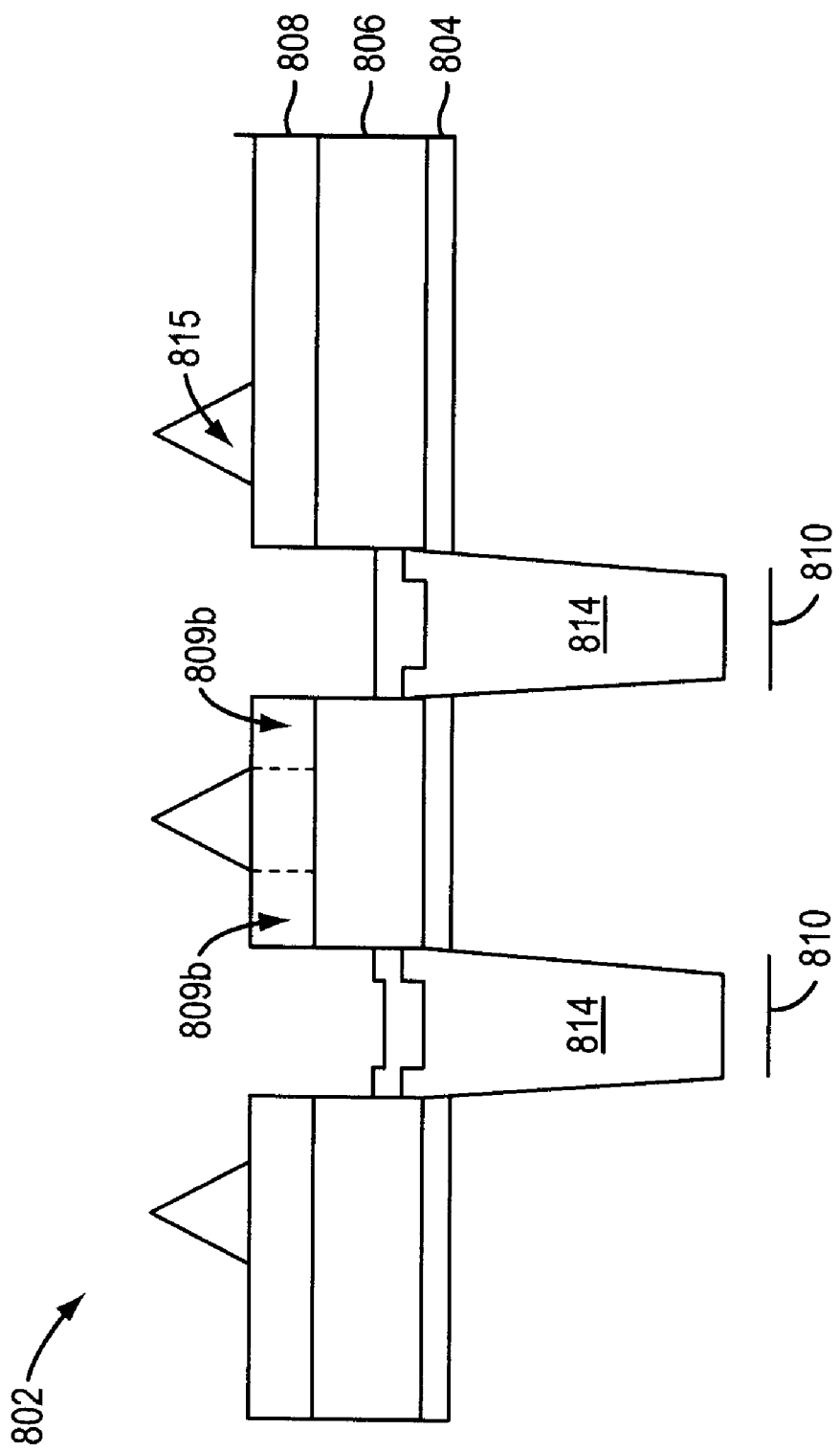

In FIG. 8E, a portion of the cap layer 808 has been exposed. For example, a HDP dip process may be used to expose a portion of the cap layer in the plurality of non-masked regions 809b.

Figure 8F:
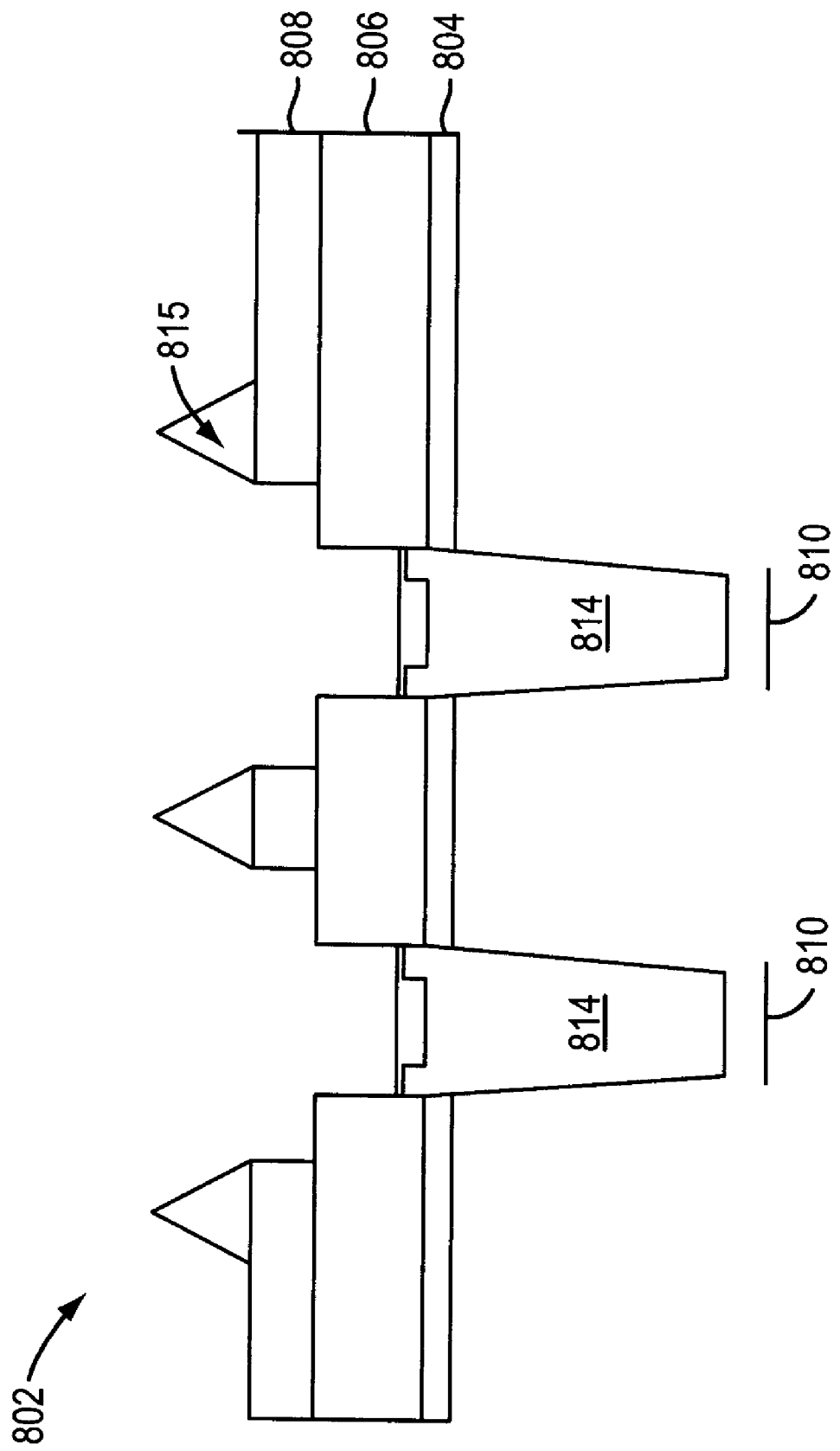

In FIG. 8F, a portion of the cap layer 808 has been removed to expose a part of the polysilicon layer 806 such that a cross-section of the cap layer 808 and the polysilicon layer 806 forms a plurality of inverted T shapes. For example, a wet etch process, with a high etching selectivity ratio between the cap layer and the polysilicon layer, may etch the cap layer 808 in the plurality of non-masked regions 809b down to the polysilicon layer 806. Alternatively, a dry etch process may be used.

Figure 8G:
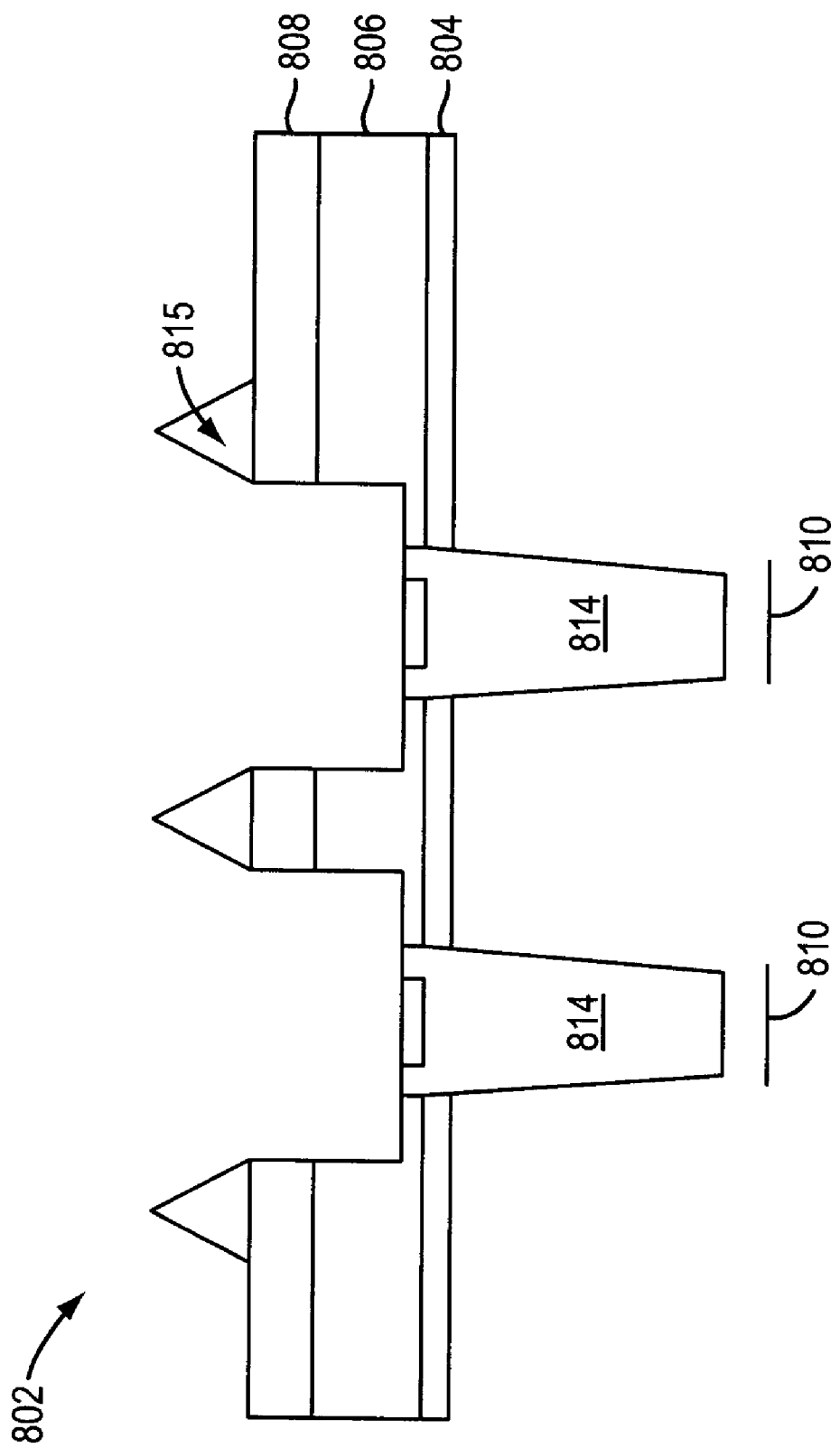

In FIG. 8G, a portion of the polysilicon layer 806 has been removed such that a cross-section of the polysilicon layer 806 forms a plurality of inverted T shapes. For example, a wet etch process may be used to partially etch through the exposed polysilicon layer 806. Alternatively, a dry etch process may be used.

Figure 8H:
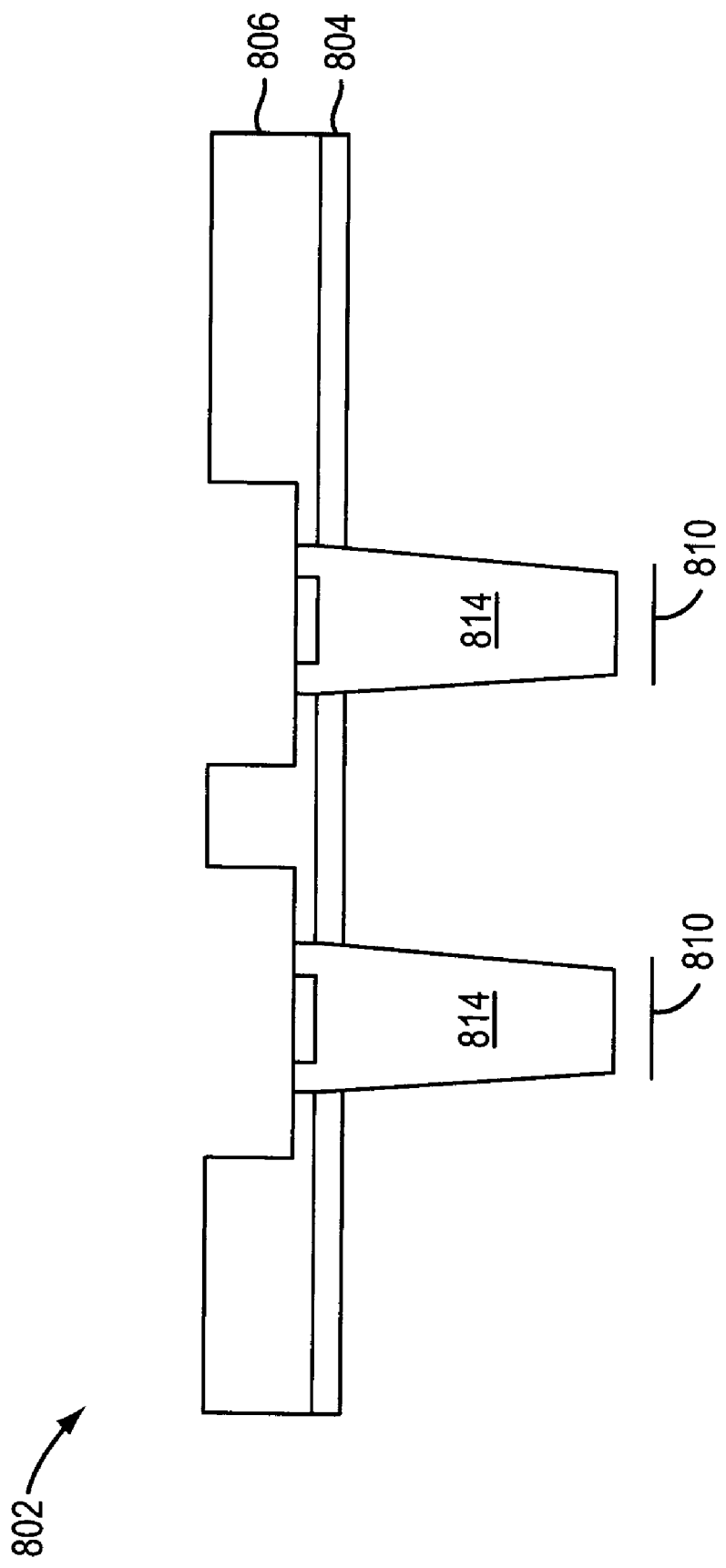

In FIG. 8H, the dielectric layer 815 and the cap layer 808 have been removed. For example, a cap layer 808 of silicon nitride may be removed by a dip in phosphoric acid ($H_3PO_4$).

Figure 8I:
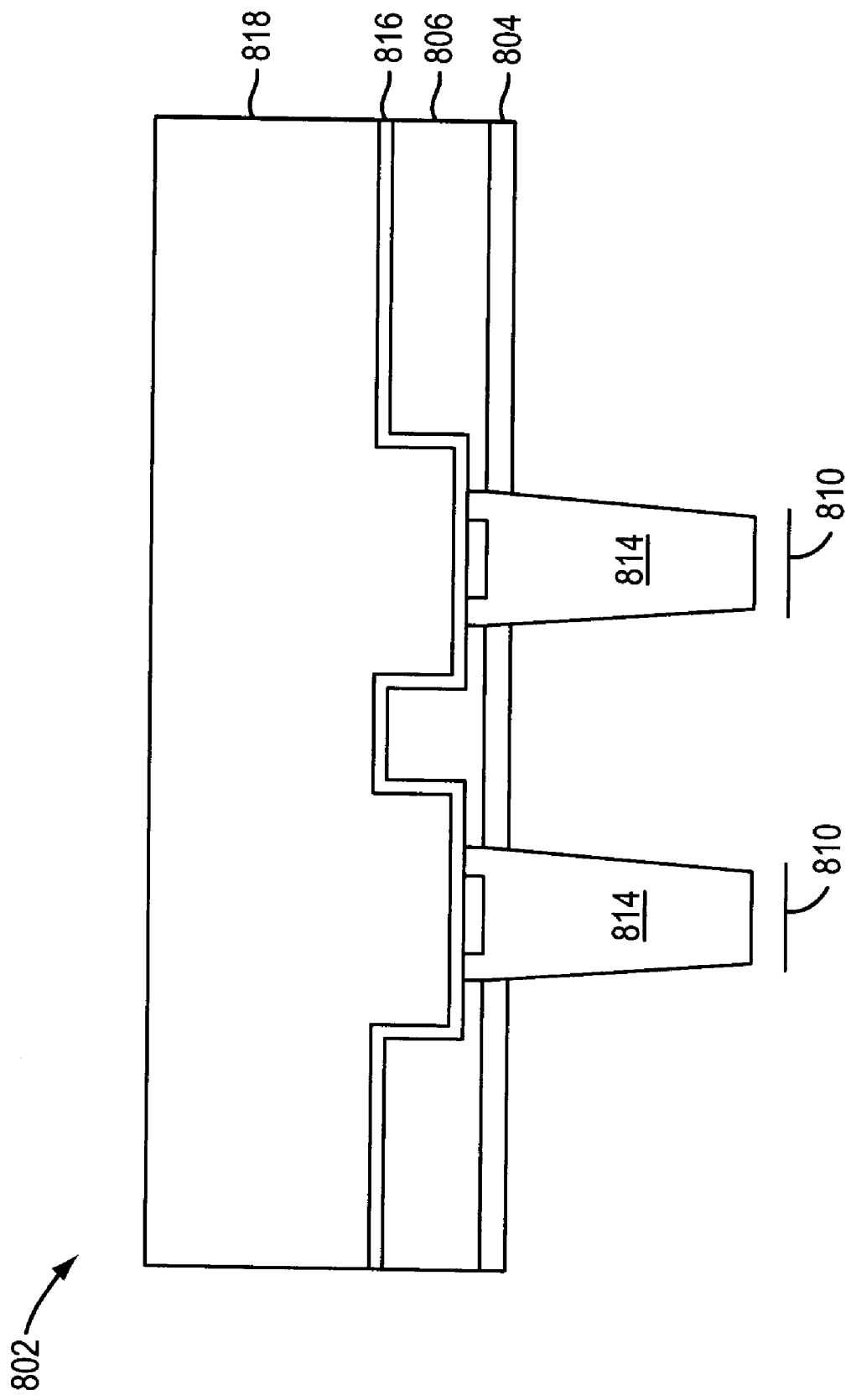

In FIG. 8I, a dielectric layer 816 has been formed on the polysilicon layer 806 and the filler oxide layer 814. A polysilicon (word line) layer 818 has been formed on the dielectric layer 816.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:

1. A method for forming a non-volatile memory device, comprising:
   providing a substrate;
   forming a tunnel layer over the substrate;
   forming a conductive layer over the tunnel layer;
   forming a cap layer on the conductive layer;

forming a plurality of trenches extending down through the cap layer, the conductive layer, the tunnel layer, and into the substrate;
filling the plurality of trenches with a dielectric material;
forming a dielectric layer having triangle-shaped peaks on the cap layer;
removing a portion of the dielectric layer to expose a first portion of the cap layer;
removing the first portion of the cap layer to expose a first portion of the conductive layer such that a cross-section of the cap layer and the conductive layer forms a plurality of structures;
removing the first portion of the conductive layer such that a cross-section of the conductive layer forms a plurality of conductive structures, wherein each of the conductive structures has a top portion and a bottom portion and wherein the top portion is narrower than the bottom portion;
forming an insulator layer over the conductive layer; and
forming a conductive line over the insulator layer.

2. The method of claim 1, further comprising:
before the filling the plurality of trenches:
forming a liner dielectric layer over the plurality of trenches.

3. The method of claim 1, wherein each of the plurality of conductive structures has one of an inverted T shape, a trapezoidal shape, and double inverted T shape.

4. A method for forming a non-volatile memory device, comprising:
providing a substrate;
forming a tunnel layer, a conductive layer and a plurality of trenches, wherein the tunnel layer is on the substrate, the conductive layer is on the tunnel layer, the trenches extend into the substrate to divide the substrate into a plurality of sections, and forming the tunnel layer and the conductive layer occurs before forming the plurality of trenches;
filling the plurality of trenches with a dielectric material to form a plurality of filled trench structures having sidewalls wherein each of the sections of the conductive layer is bounded by two adjacent sidewalls;
forming a disposable layer having triangle-shaped peaks over the conductive layer, wherein the base of each triangle-shaped peak is narrower than a width of each section;
using the triangle-shaped peak of the section as a mask to remove the portion of the section of the conductive layer;
removing a portion of a section of the conductive layer such that a cross-section of the section of the conductive layer forms an inverted T shape;
forming an insulator layer on the conductive layer; and
forming a conductive line on the insulator layer.

5. The method of claim 4, further comprising:
before filling the plurality of trenches:
forming a liner dielectric layer over the plurality of trenches.

6. A method for forming a non-volatile memory device, comprising:
providing a substrate;
forming a plurality of trenches extending down into the substrate;
filling the plurality of trenches with a dielectric material;
forming a tunnel layer over the substrate;
forming a conductive layer over the tunnel layer;
forming a cap layer on the conductive layer;
removing a second portion of the cap layer and a second portion of the conductive layer to expose at least a portion of the plurality of trenches;
removing a portion of the cap layer to expose a first portion of the conductive layer such that a cross-section of the cap layer and the conductive layer forms a plurality of structures;
removing the first portion of the conductive layer such that a cross-section of the conductive layer forms a plurality of conductive structures, wherein each of the conductive structures has a top portion and a bottom portion and wherein the top portion is narrower than the bottom portion;
forming an insulator layer over the conductive layer; and
forming a conductive line over the insulator layer.

7. The method of claim 6, further comprising:
before filling the plurality of trenches:
forming a liner dielectric layer over the plurality of trenches.

8. The method of claim 6, wherein after the step of filling, further comprising:
after filling the plurality of trenches:
forming a dielectric layer having triangle-shaped peaks on the cap layer; and
removing a portion of the dielectric layer to expose the first portion of the cap layer.

9. The method of claim 8, wherein each of the plurality of conductive structures has one of an inverted T shape, a trapezoidal shape, and double inverted T shape.

10. A method for forming a non-volatile memory device, comprising:
providing a substrate;
forming a tunnel layer, a conductive layer and a plurality of trenches, wherein the tunnel layer is on the substrate, the conductive layer is on the tunnel layer, the trenches extend into the substrate to divide the substrate into a plurality of sections, and forming the tunnel layer and the conductive layer occurs after forming the plurality of trenches;
filling the plurality of trenches with a dielectric material to form a plurality of filled trench structures having sidewalls wherein each of the sections of the conductive layer is bounded by two adjacent sidewalls;
forming a disposable layer having triangle-shaped peaks over the conductive layer, wherein the base of each triangle-shaped peak is narrower than a width of each section;
using the triangle-shaped peak of the section as a mask to remove a portion of a section of the conductive layer;
removing the portion of the section of the conductive layer such that a cross-section of the section of the conductive layer foams an inverted T shape;
forming an insulator layer on the conductive layer; and
forming a conductive line on the insulator layer.

11. The method of claim 10, further comprising:
before filling the plurality of trenches:
forming a liner dielectric layer over the plurality of trenches.

* * * * *